United States Patent [19]

Ishii et al.

[11] Patent Number: 5,028,195
[45] Date of Patent: Jul. 2, 1991

[54] HORIZONTAL/VERTICAL CONVERSION TRANSPORTING APPARATUS

[75] Inventors: Katsumi Ishii, Fujino; Atsushi Wada, Chofu, both of Japan

[73] Assignee: Tel Sagami Limited, Kanagawa, Japan

[21] Appl. No.: 469,317

[22] Filed: Jan. 24, 1990

[30] Foreign Application Priority Data

Jan. 26, 1989 [JP] Japan ................................. 1-16921

[51] Int. Cl.$^5$ .......................................... B65G 69/00
[52] U.S. Cl. .................................. 414/222; 414/172; 901/17; 901/18
[58] Field of Search ............... 414/156, 172, 180, 736, 414/222, 416; 901/17, 18, 30, 7; 198/465.6; 432/253, 11, 239, 241

[56] References Cited

U.S. PATENT DOCUMENTS

| | | | |
|---|---|---|---|
| 3,935,950 | 2/1976 | Burch | 901/17 X |
| 3,951,271 | 4/1976 | Mette | 901/17 X |
| 4,502,830 | 3/1985 | Inaba et al. | 901/17 X |
| 4,527,934 | 7/1985 | Blaseck | 901/17 X |
| 4,623,294 | 11/1986 | Schroder | 901/17 X |
| 4,770,590 | 9/1988 | Hugues et al. | 414/172 |
| 4,904,153 | 2/1990 | Iwasawa et al. | 901/17 X |
| 4,938,691 | 7/1990 | Ohkase et al. | 414/172 X |

FOREIGN PATENT DOCUMENTS 60-258459 12/1985 Japan .

*Primary Examiner*—David A. Bucci
*Attorney, Agent, or Firm*—Oblon, Spivak, McClelland, Maier & Neustadt

[57] ABSTRACT

A horizontal/vertical conversion transporting apparatus, wherein a mechanism for variably changing a distance between upper and lower boat hands for clamping an article therebetween is mounted on a conversion arm, the conversion arm is vertically movable along a support arm, and at the same time, the conversion arm is rotatable within the plane of vertical movement.

6 Claims, 5 Drawing Sheets

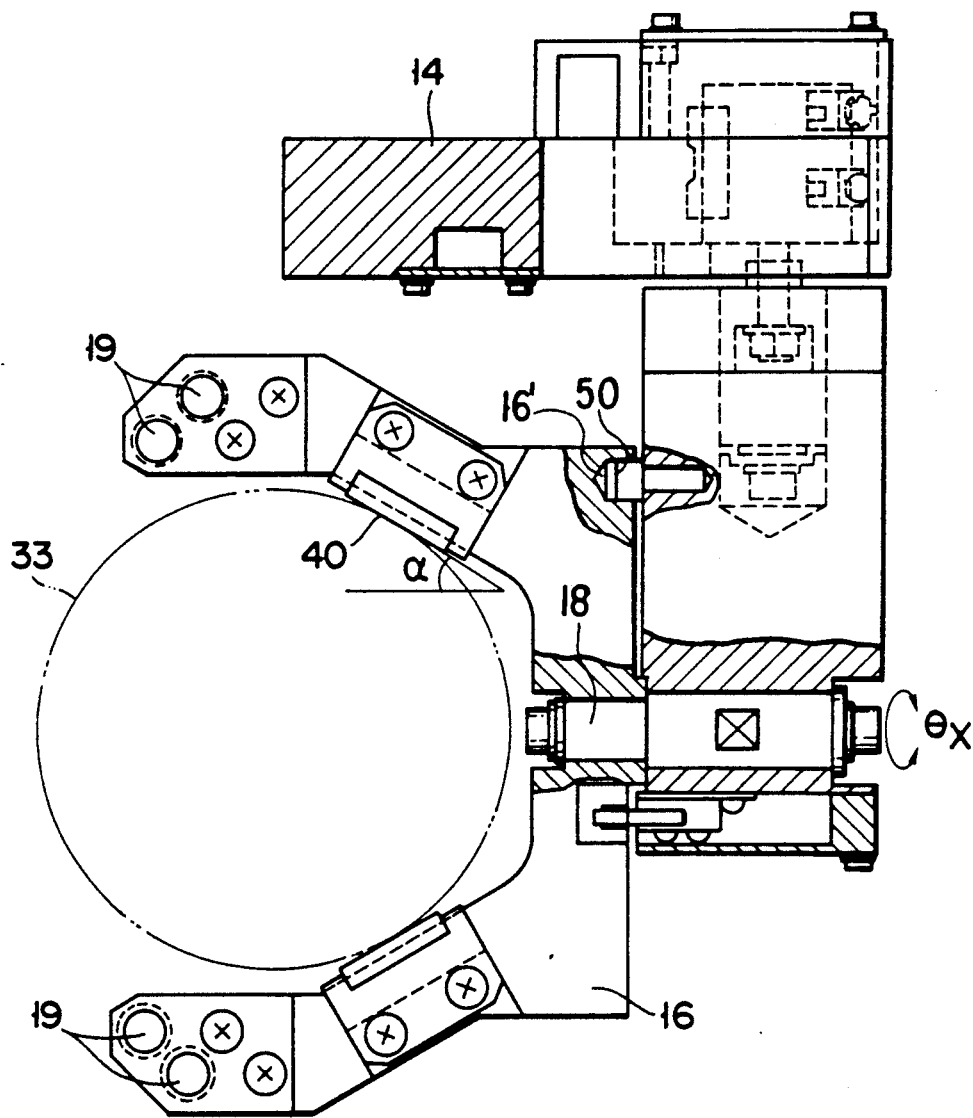
F I G. 4

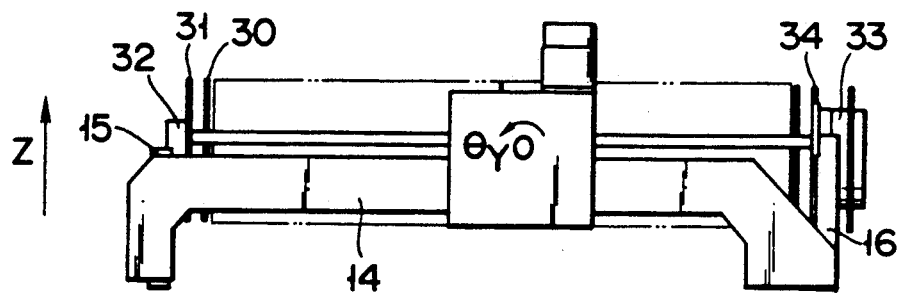
F I G. 5
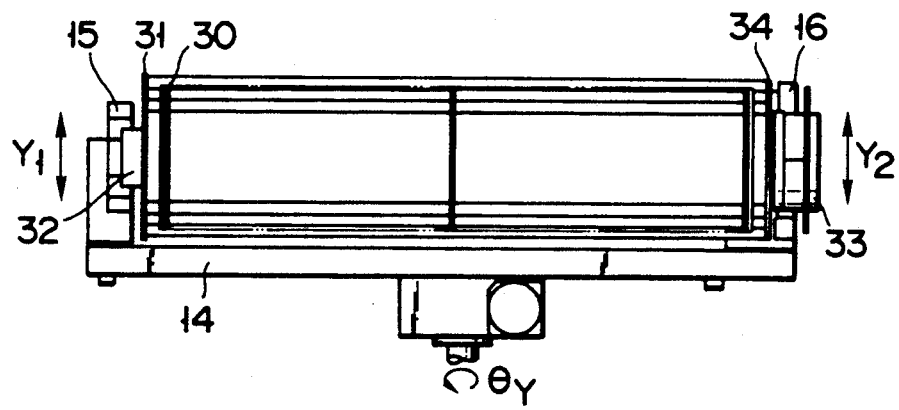
F I G. 6
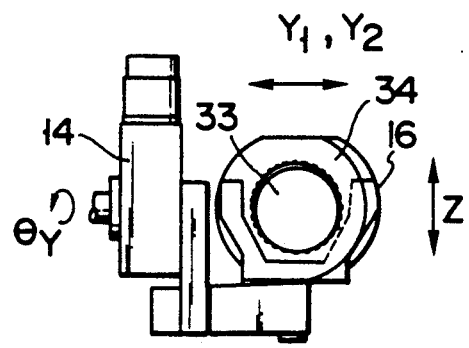
F I G. 7

HORIZONTAL/VERTICAL CONVERSION TRANSPORTING APPARATUS

BACKGROUND OF THE INVENTION

1. Field of the Invention

The present invention relates to a horizontal/vertical conversion transporting apparatus for transporting a boat which carries semiconductor wafers or the like.

2. Description of the Related Art

Various types of transporting apparatuses which hold articles to transport them to predetermined positions have been used. A typical example is a wafer boat transporting apparatus for holding a wafer boat on which a large number of semiconductor wafers are placed and transported it to a predetermined position. During transfer of an article, i.e., a wafer boat, a small deviation of a transporting position is caused by mechanical backlash in the wafer boat transporting apparatus. The errors of the transporting positions may be accumulated so as to result in a positional error as large as about several mm from the preset position. When an error of the preset position of the wafer boat occurs during transporting, reliability of transfer of the wafer boat is greatly degraded, and it is impossible to provide a highly reliable transporting apparatus.

In order to prevent an error in the preset position of the wafer boat, improvements have been made in a conventional transporting apparatus such that mechanical backlash is minimized and highly precise positioning can be performed. In this case, however, high-precision control causes an increase in cost, and requires complex adjustment of components of the apparatus. In addition, if an error of the preset position of the wafer boat occurs in such an apparatus, the wafer boat and the transporting unit are deformed during transfer of the wafer boat. The position of the boat must then be forcibly corrected.

Stresses may act on the respective parts of the wafer boat, and the wafer boat may be damaged. For example, when a vertically aligned wafer boat is to be transferred, the wafer boat may drop. A holding portion of the transporting apparatus is brought into frictional contact with the wafer boat so as to increase the amount of dust. For this reason, in a fabrication process of semiconductor devices, a countermeasure for reducing an amount of dust must be provided.

It is possible to correct a positional error during the transfer by using, e.g., an image recognition means. In this case, however, the manufacturing cost of the transporting apparatus is greatly increased.

SUMMARY OF THE INVENTION

It is an object of the present invention to provide a horizontal/vertical conversion transporting apparatus capable of easily transporting parts without causing large stresses to act on the article and its holding portion.

It is another object of the present invention to provide a horizontal/vertical conversion transporting apparatus capable of easily transporting an article without causing damage to the article or its falling.

It is still another object of the present invention to provide a horizontal/vertical conversion transporting apparatus by preventing production of dust.

It is still another object of the present invention to provide an inexpensive horizontal/vertical conversion transporting apparatus.

In order to achieve the above objects of the present invention, there is provided a horizontal/vertical conversion transporting apparatus comprising:

a table movable along a surface of a base;

a column extending upward on the movable table and rotatable about an axis as an axis of rotation extending along a longitudinal direction thereof;

a support arm movable along the longitudinal direction of the column and rotatable about an arm shaft thereof as an axis of rotation;

a conversion arm mounted on the support arm;

an upper boat hand mounted at one end of the conversion arm;

a lower boat hand mounted at the other end of the conversion arm; and means for changing a mounting angle of the lower or upper boat hand with respect to the conversion arm so as to variably set a distance between the lower and upper boat hands.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 3 and 4 are side views showing the main part of FIG. 2;

FIG. 5 is a front view of a conversion arm for explaining the transfer of wafer boat from a transfer unit to the horizontal/vertical conversion transporting apparatus;

FIG. 6 is a plan view of a conversion arm for explaining the transfer of the wafer boat from the transfer unit to the horizontal/vertical conversion transporting apparatus; and FIG. 7 is a side view of a conversion arm for explaining the transfer of the wafer from the transfer unit to the horizontal/vertical conversion transporting apparatus.

DESCRIPTION OF THE PREFERRED EMBODIMENT

Figure 1:
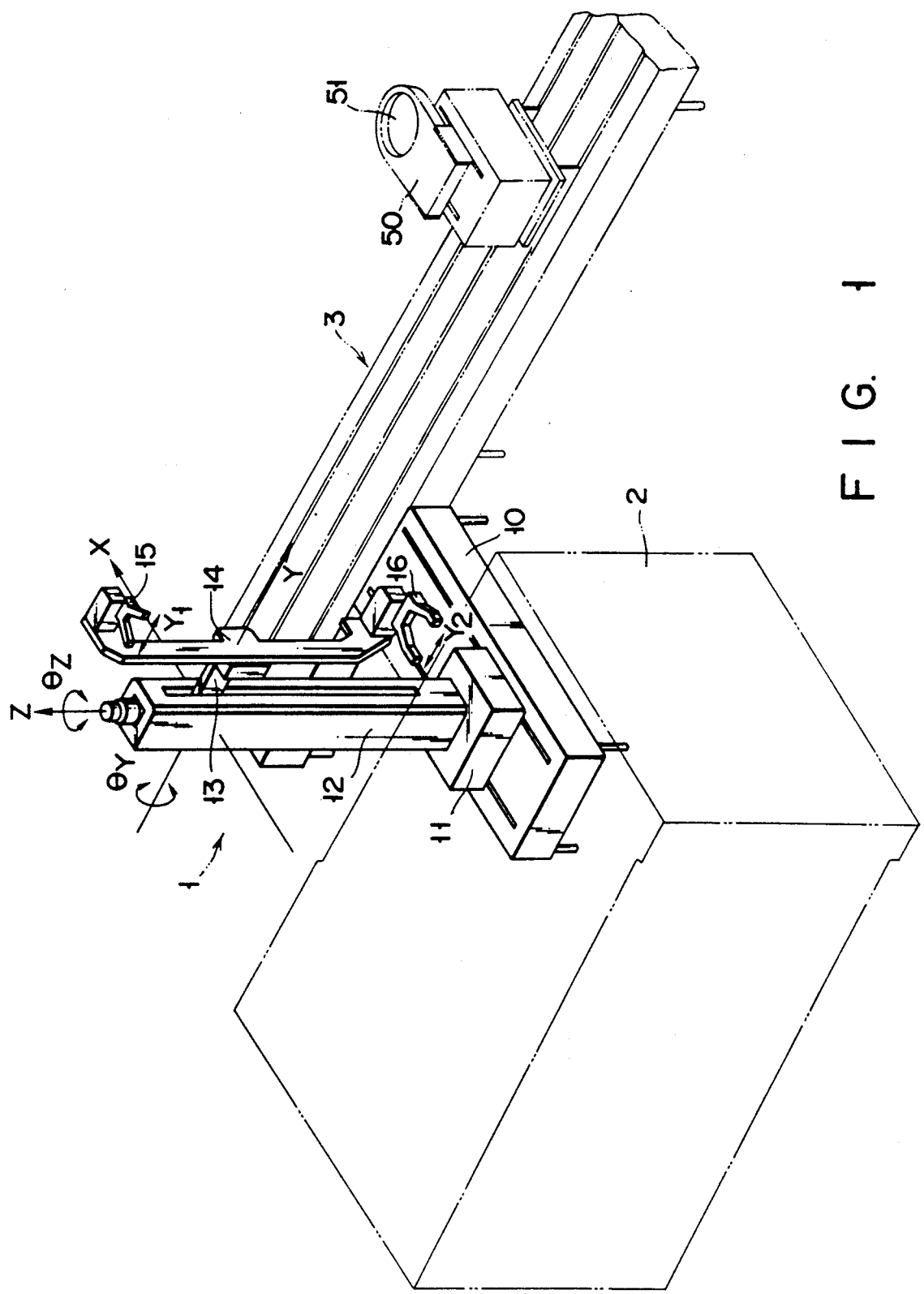
FIG. 1 is a perspective view showing a horizontal/vertical conversion transporting apparatus according to an embodiment of the present invention.

A horizontal/vertical conversion transporting apparatus for transporting a vertical annealar wafer boat according to an embodiment of the present invention will be described with reference to the accompanying drawings. FIG. 1 is a perspective view of a horizontal/vertical conversion transporting apparatus 1 according to the embodiment of the present invention. This apparatus is used for providing a wafer boat, which stores a large number of semiconductor wafers therein, from a bottom portion into a vertical type furnace of heat treatment apparatus. Thus operation and constitution of the apparatus are described as follow. A movable table 11 driven by, e.g., a stepping motor and a ball screw and movable along a predetermined direction (i.e., a direction indicated by an arrow X) is arranged on a base 10 of the horizontal/vertical conversion transporting apparatus 1. A column 12 extends upward on the movable table 11. The column 12 is driven by, e.g., a stepping motor and an internal gear, and is rotatable on the movable table 11 in the $\theta Z$ direction. A support arm 13 driven by, e.g., a stepping motor and a ball screw and movable along the longitudinal direction (i.e., a direction indicated by an arrow Z) of the column 12 is arranged on the column 12. A conversion arm 14 driven by, e.g., a stepping motor and a worm gear and pivotal through about 90° about the support arm 13 in the $\theta Y$ direction is mounted at the distal end of the support arm 13.

Upper and lower boat hands 15 and 16 movable in axial directions (i.e., the Y1 and Y2 directions) of the support arm 13 are formed at both end portions of the conversion arm 14, respectively.

Figure 2:
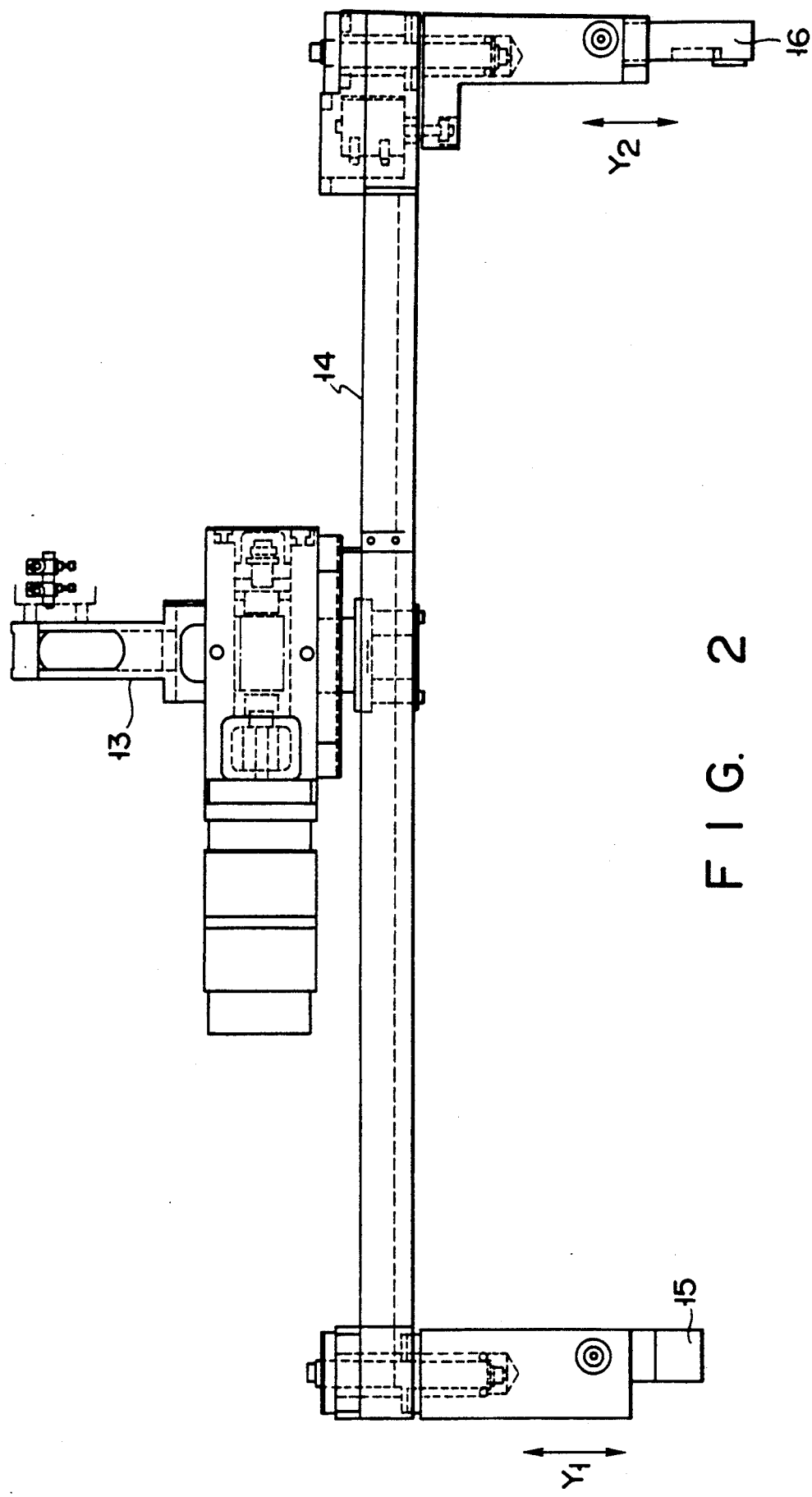
FIG. 2 is a plan view showing a main part of the horizontal/vertical conversion transporting apparatus shown in FIG. 1.
Figure 3:
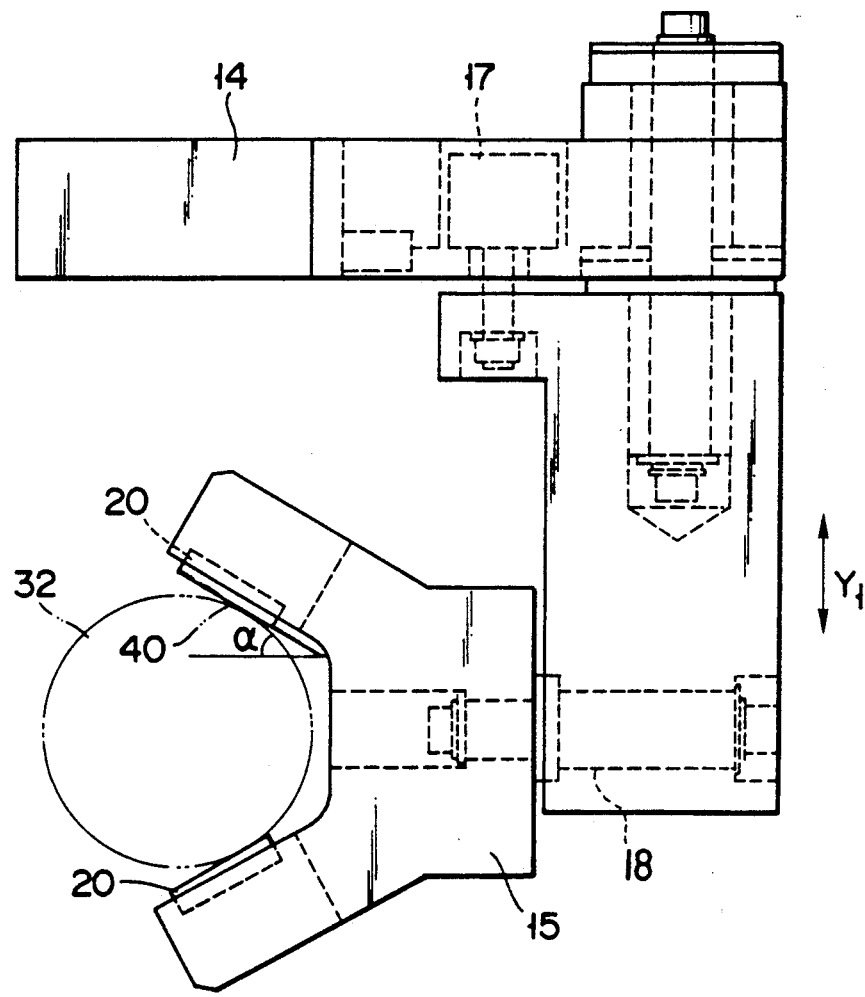

As shown in FIGS. 2 and 3, the upper boat hand 15 is movable by, e.g. several mm in the axial direction (the Y1 direction) of the support arm 13 by an air cylinder 17 serving as a drive mechanism arranged on, e.g., the conversion arm 14. In an urged state of the upper boat hand 15 by the air cylinder 17, movement of the upper boat hand 15 in the Y1 direction is limited. As a result, the upper boat hand 15 is fixed on the conversion arm 14. However, in a state wherein the air cylinder 17 is kept disabled, the upper boat hand 15 can be freely moved by several mm in the Y1 direction upon exertion of a small external force.

As shown in FIGS. 2 and 4, the lower boat hand 16 is also movable by, e.g., several mm by an air cylinder 18 in the same manner as in the upper boat hand 15. That is, in an urged state of the lower boat hand 16 by the air cylinder 18, movement of the lower boat hand 16 in the Y2 direction is limited. Therefore, the lower boat hand 16 is fixed on the conversion arm 14. To the contrary, in a state wherein the air cylinder 18 is kept disabled, the lower boat hand 16 can be moved by several mm in the Y2 direction upon exertion of a small external force. A mechanism in the form of pin 50 and at least one groove 16' for compensating for rotational backlash of about ±10° in the $\theta X$ direction is arranged on the lower boat hand 16, as shown in FIG. 4.

The horizontal/vertical conversion transporting apparatus having the above construction is arranged between a transfer unit 2 for transferring semiconductor wafers stored in, e.g., a wafer cassette, to a wafer boat, and a horizontal transporting unit 3 for transporting the vertically aligned wafer boat in the horizontal direction.

As shown in FIGS. 5 and 7, a wafer boat 31 which receives semiconductor wafers 30 from the wafer cassette by the transfer unit 2 is transferred from the transfer unit 2 to the horizontal/vertical conversion transporting apparatus, and the wafer boat 31 is rotated and aligned in the vertical direction and is transferred from the horizontal/vertical conversion transporting apparatus to the horizontal transporting unit 3.

In the horizontal/vertical conversion transporting apparatus 1, the conversion arm 14 is inserted into the lower side of the wafer boat 31 in the transfer unit 2 beforehand and waits in this state. In this state, transfer of the semiconductor wafers 30 by the transfer unit 2 is completed. The air cylinders 17 and 18 are turned off to set the upper and lower boat hands 15 and 16 to be movable in the Y1 and Y2 directions, respectively. In this state, the support arm 13 is moved upward (i.e., movement in the Z direction), and columns 32 and 33 at the both ends of the wafer boat 31 are supported by the upper and lower boat hands 15 and 16. At this time, the support arm 13 is moved upward to the position where the wafer boat 31 is supported. In this state, upward movement of the support arm 13 is temporarily stopped. The conversion arm 14 is slightly rotated in the $\theta Y$ direction so as to move the lower boat hand 16 upward.

Rotation of the conversion arm 14 is performed due to the following reason. Vertical support portions 19 of the lower boat hand 16 are brought into contact with vertical support flanges 34 of the wafer boat 31 to cause the vertical support portions 19 to support the wafer boat 31 without applying an impact on the wafer boat 31 upon dropping when horizontal/vertical conversion (to be described later) is performed.

The wafer boat 31 is supported by the upper and lower boat hands 15 and 16. Thereafter, the air cylinders 17 and 18 are immediately operated to fix the upper and lower boat hands 15 and 16.

By this operation, the upper and lower boat hands 15 and 16 can be moved in the Y1 and Y2 directions, respectively. If a positional error is present between the wafer boat 31 and the upper and lower boat hands 15 and 16, the error can be absorbed by moving the upper and lower boat hands 15 and 16 in the Y1 and Y2 directions, respectively.

At this time, in order to smoothly move the upper and lower boat hands 15 and 16, respectively, in the Y1 and Y2 directions, an inclination angle $\alpha$ of a contact surface (support surface) 40 of the upper or lower boat hand 15 or 16 which contacts the wafer boat 31 must exceed a predetermined angle, as shown in FIG. 3 or 4. The inclination angle $\alpha$ must be appropriately selected in accordance with a friction coefficient of a contact portion between the upper or lower boat hand 15 or 16 and the wafer boat 31. When both the wafer boat 31 and the upper and lower boat hands 15 and 16 are made of quartz, the inclination angle ($\alpha$) is preferably smaller than about 50°. In this embodiment, the inclination angle ($\alpha$) is set to be 30°.

As described above, the horizontal/vertical conversion transporting apparatus receives the wafer boat from the transfer unit 2. The movable table 11 is then moved in the X direction (toward the transporting apparatus 3 in the horizontal direction.) Thereafter, the conversion arm 14 is rotated through about 90° in the $\theta Y$ direction, thereby aligning the wafer boat 31 in the vertical direction.

As shown in FIG. 4, the lower boat hand 16 supports the wafer boat 31 by the vertical support portions 19 located before the center of gravity of the wafer boat 31. That is, the upper boat hand 15 is arranged to cause support portions 19 to support side surfaces of the upper end portion of the wafer boat 31 in the same manner as in the horizontal supporting operation. In other words, the conversion arm 14 is slightly rotated in the $\theta Y$ direction during the transfer as described above. The vertical support portions 19 of the lower boat hand 16 are kept in contact with the wafer boat 31. As a result, the wafer boat 31 can be supported by the vertical support portions 19 without any impact upon dropping.

The column 12 is then rotated through about 90° in the θZ direction. The wafer boat 31 is directed in the transporting direction of the horizontal transporting unit 3. At this time, the movable table 11 is moved in the X direction (toward the horizontal transporting unit 3) and the wafer boat 31 is moved onto a transporting table 50 of the horizontal transporting unit 3. The conversion arm 14 is moved downward (movement in the Z direction) to transfer the wafer boat 31 to the transporting table 50 of the horizontal transporting unit 3.

A boat support portion 51 as a circular recess is formed in the transporting table 50 and receives a lower cylindrical portion 33 of the wafer boat 31. The diameter of the boat support portion 51 is slightly larger than that of the lower cylindrical portion of the wafer boat 31. For example, the diameter of the lower cylindrical portion of the wafer boat 31 is 100 mm, whereas the diameter of the boat support portion 51 is 102 mm.

The position of the wafer boat 31 is converted from the horizontal direction to the vertical direction, and the wafer boat 31 is transferred from the transfer unit 2 to the horizontal transporting unit 3. Thereafter, the horizontal transporting unit 3 transports the wafer boat 31 to a vertical annealer. Treatments of the wafer 30 such as formation of an oxide film, formation of a CVD film, and thermal diffusion are performed.

When the treatments to the semiconductor wafers 30 are completed, the wafer boat 31 is transferred from the horizontal transporting unit 3 to the horizontal/vertical conversion transporting apparatus 1. As described above, the diameter of the boat support portion 51 of the transporting table 50 is slightly larger than that of the lower cylindrical portion of the wafer boat 31. For this reason, the position of the wafer boat 31 may be slightly offset from the position where the horizontal/vertical conversion transporting apparatus 1 is placed on the boat support portion 51. The same operation as in transfer from the transfer unit 2 to the horizontal/vertical conversion transporting apparatus 1 is performed. That is, the air cylinders 17 and 18 of the horizontal/vertical conversion transporting apparatus 1 are kept off. The upper and lower boat hands 15 and 16 are kept movable in the Y1 and Y2 directions, respectively. The positional error is absorbed by moving the upper and lower boat hands 15 and 16, respectively, in the Y1 and Y2 directions.

Thereafter, when the wafer boat 31 is transferred from the horizontal/vertical conversion transporting apparatus 1 to the transfer unit 2, operations opposite to those in transfer from the transfer unit 2 to the horizontal/vertical conversion transporting apparatus 1 are performed. The air cylinders 17 and 18 of the horizontal/vertical conversion transporting apparatus 1 are turned off immediately before transfer. The upper and lower boat hands 15 and 16 are set so as to be movable, respectively, in the Y1 and Y2 directions. In this manner, the positional error can be absorbed by movement of the upper and lower boat hands 15 and 16, respectively, in the Y1 and Y2 directions.

The wafer boat 31 is transferred to the transfer unit 2 in this manner. The transfer unit 2 stores the treated semiconductor wafers 30 in the wafer cassette. When a further treatment is to be performed, the next semiconductor wafers 30 are transferred from the wafer cassette to the wafer boat 31.

If a positional error is present during transfer of the wafer boat 31 in the horizontal/vertical conversion transporting apparatus of this embodiment, the upper and lower boat hands 15 and 16 are moved in the Y1 and Y2 directions, respectively, to absorb this positional error. Stress caused by the positional error can be prevented, and damage to the wafer boat 31 can also be prevented. In addition, the wafer boat 31 aligned in the vertical direction will not fall off. Furthermore, production of a large amount of dust by friction between the wafer boat and the horizontal/vertical conversion transporting apparatus can be greatly reduced. Moreover, since an expensive mechanism such as an image recognizing means need not be used, a large increase in manufacturing cost can be prevented.

In the horizontal/vertical conversion transporting apparatus according to the present invention, as has been described above, positional error during transfer of an article can be absorbed without causing large stresses to act on the article and a holding portion for holding the article and without greatly increasing the manufacturing cost. Therefore, the possibility of damage to the article upon the article falling off can be reduced, and the amount of dust can be reduced.

Additional advantages and modifications will readily occur to those skilled int he art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A horizontal/vertical conversion transporting apparatus for a vertical heat treatment device, comprising:
   a table movable along a surface of a base;
   a column extending upward on said movable table and rotatable about an axis of rotation extending along a longitudinal direction thereof:
   a support arm movable along the longitudinal direction of said column;
   a conversion arm rotatable about an arm shaft thereof as an axis of rotation and mounted on said support arm;
   an upper boat hand mounted at one end of said conversion arm;
   a lower boat hand mounted at the other end of said conversion arm;
   means for changing a mounting angle of said lower or upper boat hand with respect to said conversion arm so as to stably set a distance between said lower and upper boat hands; and
   means for compensating for backlash of a mechanical mechanism arranged on said conversion arm, said backlash occurring between said conversion arm and said lower or upper boat hand upon a change in mounting angle of said lower or upper boat hand with respect to said conversion arm.

2. An apparatus according to claim 1, wherein said upper and lower boat hands comprise vertical support portions for supporting the article.

3. An apparatus according to claim 2, wherein said vertical support portions are formed at portions of two two-articulated fingers.

4. An apparatus according to claim 1, wherein said means for changing the mounting angle of said lower or upper boat hand with respect to said conversion arm is a cylinder mechanism mounted on said conversion arm.

5. An apparatus according to claim 1, wherein said base is arranged between a transfer unit and a horizontal transporting unit, and said movable table is reciprocated between said transfer unit and said horizontal transporting unit.

6. An apparatus according to claim 1, wherein the article is a wafer boat which stores a large number of semiconductor wafers therein.

* * * * *